(12) United States Patent
Anc

(10) Patent No.: US 8,455,898 B2
(45) Date of Patent: Jun. 4, 2013

(54) LED DEVICE UTILIZING QUANTUM DOTS

(75) Inventor: Maria J. Anc, Groveland, MA (US)

(73) Assignee: Osram Sylvania Inc., Danvers, MA (US)

( * ) Notice: Subject to any disclaimer, the term of this patent is extended or adjusted under 35 U.S.C. 154(b) by 0 days.

(21) Appl. No.: 13/073,153

(22) Filed: Mar. 28, 2011

(65) Prior Publication Data

US 2012/0248479 A1    Oct. 4, 2012

(51) Int. Cl.
*H01L 33/00* (2010.01)

(52) U.S. Cl.
USPC .................................. 257/98; 257/E33.059

(58) Field of Classification Search
CPC .. H01L 33/69; H01L 33/20; H01L 3/62; B82Y 10/00; B82Y 20/00; B82Y 30/00
USPC ............. 257/79, 98, E33.059; 977/774, 949, 977/950
See application file for complete search history.

(56) References Cited

U.S. PATENT DOCUMENTS

| 6,599,631 | B2 * | 7/2003 | Kambe et al. | 428/447 |
|---|---|---|---|---|
| 7,772,551 | B2 | 8/2010 | Todori et al. | |
| 7,804,103 | B1 | 9/2010 | Zhai et al. | |
| 2006/0068154 | A1 * | 3/2006 | Parce et al. | 428/76 |
| 2006/0099449 | A1 | 5/2006 | Amano et al. | |
| 2006/0244358 | A1 | 11/2006 | Kim et al. | |
| 2007/0034833 | A1 | 2/2007 | Parce et al. | |
| 2007/0090755 | A1 | 4/2007 | Eida et al. | |
| 2007/0221947 | A1 | 9/2007 | Locascio et al. | |
| 2007/0287208 | A1 | 12/2007 | Thompson et al. | |
| 2008/0173886 | A1 * | 7/2008 | Cheon et al. | 257/98 |
| 2008/0231170 | A1 | 9/2008 | Masato et al. | |
| 2010/0123155 | A1 | 5/2010 | Pickett et al. | |

FOREIGN PATENT DOCUMENTS

| EP | 1 895 600 A1 | 3/2008 |
|---|---|---|
| JP | 2004-71357 | 3/2004 |
| WO | 2005/067524 A2 | 7/2005 |

OTHER PUBLICATIONS

Klimov et al., "Optical Gain and Stimulated Emission in Nanocrystal Quantum Dots", 2000, Science vol. 290, pp. 314-317.*
Xi et al., Optical thin-film materials with low refractive index for broadband elimination of Fresnel reflection, Nature Photonics, 2007, p. 176-179, vol. 1.
Anikeeva et al., Electroluminescence from a Mixed Red-Green-Blue Colloidal Quantum Dot Monolayer, Nano Letters, 2007, p. 2196-2200, vol. 7, No. 8.
Micic et al., Size-Dependent Spectroscopy of InP Quantum Dots, J. Phys. Chem. B, 1997, p. 4904-4912, vol. 101.
Crooker et al., Spectrally Resolved Dynamics of Energy Transfer in Quantum-Dot Assemblies: Towards Engineered Energy Flows in Artificial Materials, Physical Review Letters, 2002, p. 186182-1, vol. 89, No. 18.

(Continued)

*Primary Examiner* — Nikolay Yushin
(74) *Attorney, Agent, or Firm* — Robert F. Clark

(57) ABSTRACT

There is herein described a LED lighting device utilizing quantum dots in layers on top of an LED chip. The quantum dots layers and the LED chip are arranged with gradient refractive indices, so that the refractive index of each layer is preferably less than the refractive index of the immediately underlying layer or chip. The quantum dots with emission peaks at longer wavelengths are preferably arranged in lower layers closer to the LED chip; while the quantum dots with emission peaks at shorter wavelengths are arranged in higher layers farther from the LED chip.

18 Claims, 3 Drawing Sheets

OTHER PUBLICATIONS

Kagan et al., Electronic Energy Transfer in CdSe Quantum Dot Solids, Physical Review Letters, 1996, p. 1517-1520, vol. 76, No. 9.

Dabbousi et al., (CdSe)ZnS Core-Shell Quantum Dots: Synthesis and Characterization of a Size Series of Highly Luminescent Nanocrystallites, J. Phys. Chem. B, 1997, p. 9463-9475, vol. 101.

Rottkay et al., Effective Medium Approximation of the Optical Properties of Electrochromic Cerium-Titanium Oxide Compounds, SPIE, 1997, p. 9-19, vol. 3138.

Kubo et al., Tunability of the Refractive Index of Gold Nanoparticle Dispersions, Nano Letters, 2007, p. 3418-3423, vol. 7, No. 11.

Hines et al., Bright UV-Blue Luminescent Colloidal ZnSe Nanocrystals, The Journal of Physical Chemistry B, 1998, p. 3655-3657, vol. 102, No. 19.

Abstract, JP 2004-071357 (Mar. 4, 2004).

* cited by examiner

LED DEVICE UTILIZING QUANTUM DOTS

TECHNICAL FIELD

This invention relates to light emitting diode ("LED") devices and lamps. In particular, this invention relates to LED devices and lamps containing quantum dots ("QDs") for converting the light emitted from a light source into a light of different wavelengths.

BACKGROUND

Existing LEDs can emit light in the ultraviolet ("UV"), visible or infrared ("IR") wavelength range. These LEDs generally have narrow emission spectra which means that LEDs can not be directly used to produce broad-spectrum light such as white light. Phosphors can be introduced to convert a portion of the light originally emitted by the LED into light of a different wavelength. The combination of the converted light and the originally emitted light renders a more desirable output light. For example, a typical white-emitting LED contains a YAG:Ce phosphor which exhibits a quantum efficiency >85% over a broad spectral range. But the white light converted by only one type of phosphor typically has a low color rendering index ("CRI") and can only reach a limited range of color temperatures.

Quantum dots ("QDs", also known as semiconductor nanocrystals) can be used to convert the light emitted by LEDs to generate light in the visible or infrared regions. Quantum dots are nanocrystals that have a diameter smaller than the bulk exciton Bohr radius. Due to the quantum confinement effects, the energy differences between electronic states of a quantum dot are a function of both the composition and the physical size of the quantum dot. Thus, the optical and optoelectronic properties of quantum dots can be tuned and adjusted by changing the physical size of the quantum dots. The quantum dots absorb all wavelengths shorter than the absorption peak wavelength and emit light at a longer wavelength. The bandwidth of the quantum dot luminescent spectra is related to temperature dependent Doppler broadening, the Heisenberg Uncertainty Principle, and the size distribution of the quantum dots. For a given quantum dot, the emission band of the quantum dot can be controlled by changing the size. Thus, the quantum dot can produce a range of colors that are unattainable with conventional phosphors. For example, 2 nm CdSe quantum dots emit in the blue region of the visible spectrum while 10 nm CdSe quantum dots emit in the red region of the visible spectrum.

The emission band of a certain type of quantum dots can have an overlap with the absorption band of a second type of quantum dots. Therefore, the light converted by the first quantum dots can be absorbed again by the second quantum dots. Thus, the light is absorbed and converted twice via two conversion processes. This self absorption is undesirable because the energy loss due to two conversions with less than 100% efficiency reduces the overall efficacy of the LED device.

Another important factor for the efficacy is the Fresnel reflection. When light moves from a first medium of refractive index $n_1$ into a second medium of refractive index $n_2$, both reflection and refraction of the light may occur. For example, the reflection coefficient R at near-normal incidence is given by:

$$R = \left(\frac{n_1 - n_2}{n_1 + n_2}\right)^2. \quad (1)$$

Thus, if there is a large difference between the refractive indices of these two media, a significant portion of light is reflected back into the first medium. Furthermore, the critical angle, which is defined as the angle of incidence above which total internal reflection occurs, increases as the ratio of refractive indices increases (difference is decreasing) ($\theta_c$ arcsin($n_2/n_1$)).

LED chips are semiconductors that have refractive indices from 2.4 to 3.5. In contrast the encapsulant of the LED, such as silicone or epoxy, has a refractive index of from 1.5 to 1.7. Thus, a large portion of the light is reflected back and absorbed by the LED chip due to Fresnel reflection at the chip-encapsulant interface. The addition of phosphors, such as YAG:Ce having a refractive index of about 1.85 at 450 nm, does not help alleviate the problem. Oxide particles such as $TiO_2$ and $ZrO_2$ particles can be introduced in a matrix material to achieve some intermediate refractive index. But a typical diameter of $TiO_2$ and $ZrO_2$ particles is above one micron, which is more than 10 times the wavelength of the emitted visible light. Thus, the $TiO_2$ and $ZrO_2$ particles serve as scattering centers and scatter the light isotropically.

SUMMARY OF THE INVENTION

It is an object of the invention to obviate the disadvantages of the prior art.

It is a further object of the invention to provide a high efficiency LED lighting device containing quantum dots and a reliable means of reducing self absorption and Fresnel reflection.

According to an embodiment, there is provided a lighting device. The lighting device includes a light source, a first luminescent layer disposed on top of the light source, and a second luminescent layer disposed on top of the first luminescent layer. The light source has a source refractive index. The first luminescent layer includes a first quantum dots composition dispersed in a first matrix material. A first volume fraction of the first quantum dots composition is arranged so that the first effective refractive index of the first luminescent layer is equal to or less than the source refractive index. The second luminescent layer includes a second quantum dots composition dispersed in a second matrix material. A second volume fraction of the second quantum dots composition is arranged so that the second effective refractive index of the second luminescent layer is less than the first effective refractive index of the first luminescent layer.

According to another embodiment, there is provided a lighting device. The lighting device includes a InGaN light emitting diode, a first luminescent layer disposed directly on top of the InGaN light emitting diode, and a second luminescent layer disposed directly on top of the first luminescent layer. The InGaN light emitting diode has a source refractive index. The first luminescent layer has a first effective refractive index. The first luminescent layer includes a InP quantum dots composition dispersed in a first matrix material. The InP quantum dots composition has a first emission spectrum having a first peak wavelength. The InP quantum dots composition has a first volume fraction. The first volume fraction is arranged so that the first effective refractive index is less than the source refractive index. The second luminescent layer has a second effective refractive index. The second luminescent layer includes a $CuInS_2$ quantum dots composition dispersed in a second matrix material. The CuInS$_2$ quantum dots composition has a second emission spectrum having a second peak wavelength. The second peak wavelength is shorter than the first peak wavelength. The CuInS$_2$ quantum dots composition has a second volume fraction. The second volume fraction is arranged so that the second effective refractive index is less than the first effective refractive index.

According to yet another embodiment, there is provided a lighting device. The lighting device includes an AlGaN light emitting diode, a first luminescent layer disposed directly on top of the AlGaN light emitting diode, a second luminescent layer disposed directly on top of the first luminescent layer, and a third luminescent layer disposed directly on top of the second luminescent layer. The AlGaN light emitting diode has a source refractive index. The first luminescent layer has a first effective refractive index. The first luminescent layer includes a first InP quantum dots composition dispersed in a first matrix material. The first InP quantum dots composition has a first emission spectrum having a first peak wavelength. The first InP quantum dots composition has a first volume fraction. The first volume fraction is arranged so that the first effective refractive index is less than the source refractive index. The second luminescent layer has a second effective refractive index. The second luminescent layer includes a second InP quantum dots composition dispersed in a second matrix material. The second InP quantum dots composition has a second emission spectrum having a second peak wavelength. The second peak wavelength is shorter than or equal to the first peak wavelength. The second InP quantum dots composition has a second volume fraction. The second volume fraction is arranged so that the second effective refractive index is less than the first effective refractive index. The third luminescent layer has a third effective refractive index. The third luminescent layer includes a ZnSe quantum dots composition dispersed in a third matrix material. The ZnSe quantum dots composition has a third emission spectrum having a third peak wavelength. The third peak wavelength is shorter than the second peak wavelength. The ZnSe quantum dots composition has a third volume fraction. The third volume fraction is arranged so that the third effective refractive index is equal to or less than the second effective refractive index.

The arrangement of layers with gradient refractive indices helps minimize the index difference at the layer interfaces. Thus, the Fresnel reflections at the layer interfaces, as well as the overall reflection, can be significantly reduced. The quantum dots with emission peaks at longer wavelengths may be arranged in lower layers closer to the LED chip; while the quantum dots with emission peaks at shorter wavelengths may be arranged in higher layers farther from the LED chip. Therefore, there is less of a chance of self absorption among the quantum dots, which leads to a better conversion efficiency.

DETAILED DESCRIPTION

For a better understanding of the present invention, together with other and further objects, advantages and capabilities thereof, reference is made to the following disclosure and appended claims taken in conjunction with the above-described drawings.

Figure 1:
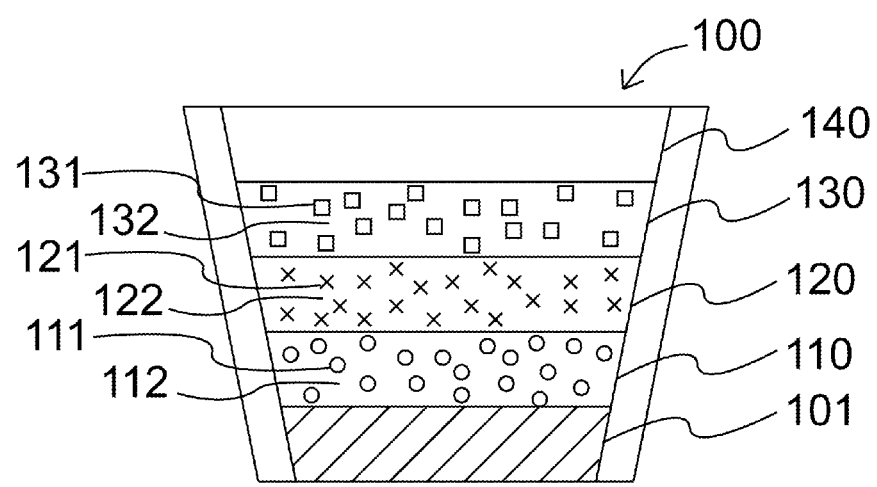
FIG. 1 is a schematic illustration of a lighting device according to an embodiment of the invention.

With reference to FIG. 1, a lighting device 100, in accordance with an embodiment of the invention is shown. The lighting device 100 includes a light source 101, which may be one or more LED chips, e.g. a blue-emitting or ultraviolet-emitting LED chip. The lighting device 100 is designed to produce a broad-spectrum light output, such as a white light with a high color rendering index. The broad-band output light is produced by converting some of the original light generated by the light source into light with longer wavelengths using quantum dots alone or combination with traditional phosphors.

As shown in FIG. 1, the light source 101 may be a blue LED chip, preferably a InGaN LED chip, emitting light at a wavelength from about 430-485 nm. The InGaN blue LED chip 101 has a refractive index of 2.61 at 450 nm. A first luminescent layer 110 may be disposed directly on top of the blue LED chip 101. The term "directly" means that the first luminescent layer 110 is in direct contact of the surface of the blue LED chip 101. The first luminescent layer 110 contains a composition of quantum dots 111 dispersed in a matrix 112. The quantum dots 111 are preferably, but are not limited to, indium phosphide ("InP") quantum dots. The InP quantum dots may be overcoated with a ZnS shell to passivate the surface states and to increase the quantum efficiency. The quantum dots 111 may have an average particle diameter of 3 nm and an emission peak at 630 nm. Such InP quantum dots are commercially available from NN-Labs, Fayetteville Ark. (Catalog No. INP630). The refractive index of InP quantum dots 111 is 4.07 at 450 nm. The volume fraction of quantum dots 111 in the first luminescent layer 110 may be about 30%. The material of matrix 112 is preferably a polymer, however, the matrix material may also be, but is not limited to, a silicone, epoxy, acrylic, plastic, or glass. The refractive index of matrix 112 may be about 1.5. If the quantum dots 111 are introduced in liquid phase, the solvent may be removed by evaporation after quantum dots 111 are dispersed in the matrix 112.

The effective refractive index of a quantum-dots-containing layer may be determined as follows:

$$n_{eff} = n_{QD} c + n_{matrix}(1-c); \qquad (2)$$

where $n_{eff}$ is the effective refractive index, $n_{QD}$ and $n_{matrix}$ are the refractive indices of the quantum dots and matrix, respectively; and c is the volume fraction of quantum dots in the layer. Thus, the effective refractive index of the first luminescent layer 110 may be about 2.3 at a quantum dots volume fraction of 30%. ($n_{QD}$=4.07 for InP quantum dots, c=0.3, and $n_{matrix}$=1.5).

Preferably, the effective refractive index of the first luminescent layer 110 is at least 2 so that the critical angle is at least 50 degrees thereby minimizing total internal reflection. The effective refractive index of the first luminescent layer 110 may be equal to, and is preferably less than, the refractive index of light source 101.

Figure 2:
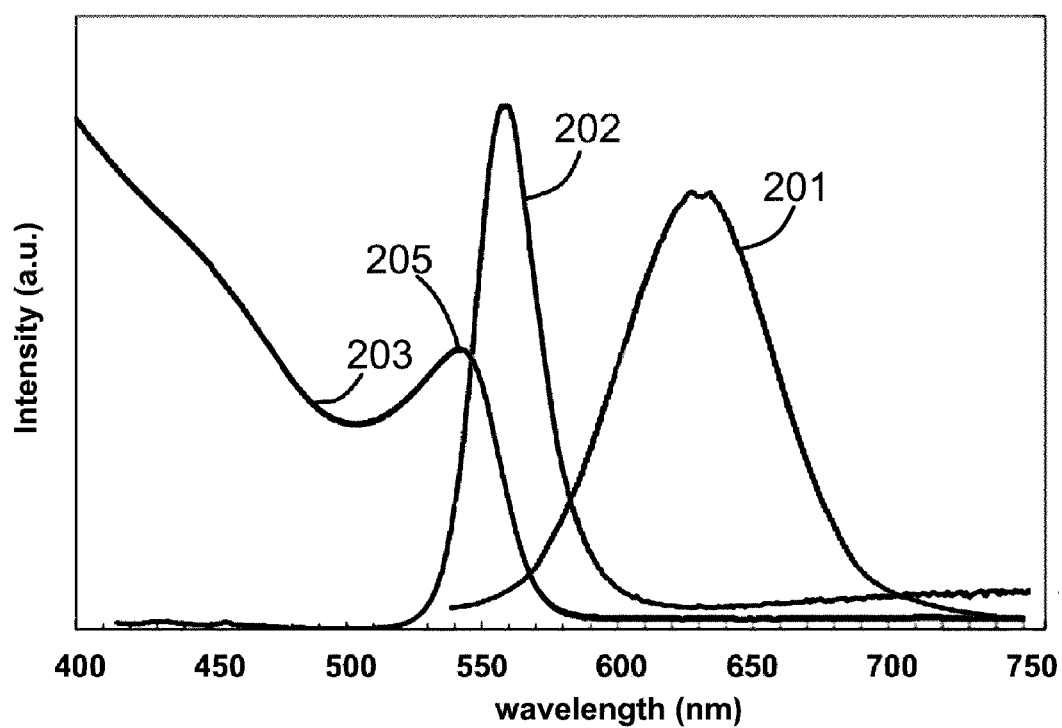
FIG. 2 shows the absorption and emission spectra of various compositions of quantum dots.

An emission spectrum 201 of quantum dots 111 is shown in FIG. 2. The peak wavelength of the emission spectrum is at 630 nm.

Referring again to FIG. 1, second luminescent layer 120 may be disposed directly on top of the first luminescent layer 110. The second luminescent layer 120 contains a composition of quantum dots 121 dispersed in a matrix 122. The quantum dots 121 may be, but are not limited to, cadmium selenide ("CdSe") quantum dots. The CdSe quantum dots may be composed of cadmium selenide with a capping agent made of a long-chain organic compound such as hexadecylamine ("HAD"), which provides enhanced longevity and stability. The quantum dots 121 may have an average particle diameter of 3.3 nm and an emission peak at 560 nm. An emission spectrum 202 of CdSe quantum dots is shown in FIG. 2, together with an absorption spectrum 203 of CdSe quantum dots. Such CdSe quantum dots are commercially available as Lumidot™ 560 from Nanoco Technologies Ltd, Manchester, United Kingdom. The refractive index of CdSe quantum dots 121 is about 2.5 at 450 nm. The volume fraction of quantum dots 121 in the second luminescent layer 120 may be 50%. The material of matrix 122 is preferably a polymer, however, the matrix material may also be, but is not limited to, a silicone, epoxy, acrylic, plastic, or glass. The refractive index of matrix 122 may be 1.5. The effective refractive index of the second luminescent layer 120 may be 2.0 at a quantum dots volume fraction of 50%. The emission spectrum of quantum dots 121 has a peak wavelength that is preferably shorter than the peak wavelength of the emission spectrum of quantum dots 111.

Preferably, the effective refractive index of the second luminescent layer 120 is at least 1.6 to minimize the Fresnel reflection and the total internal reflection.

Alternatively, in some embodiments, the quantum dots 121 may be the same as quantum dots as in the first luminescent layer 110, e.g. InP quantum dots. The volume fraction of quantum dots 121 in the second luminescent layer 120 may be about 20%. The effective refractive index of the second luminescent layer 120 may be about 2.0 at a quantum dots volume fraction of 20%. The volume fraction of quantum dots 121 is chosen to be less than the volume fraction of quantum dots 111 so that the effective refractive index of second luminescent layer 120 is less than the effective refractive index of luminescent layer 110. Although the quantum dots in the second luminescent layer may be comprised of the same material as in the first luminescent layer, the quantum dots in the second luminescent layer may be of a smaller size so that they emit at a shorter wavelength than the quantum dots in the first luminescent layer.

Alternatively, in some other embodiments, the quantum dots 121 may be preferably $CuInS_2$ quantum dots. The refractive index of quantum dots $CuInS_2$ is 2.9. The volume fraction of quantum dots 121 in the second luminescent layer 120 may be about 36%. The effective refractive index of the second luminescent layer 120 may be about 2.0 at a quantum dots volume fraction of 36%.

In another embodiment, the lighting device 100 may further contain a third luminescent layer 130. The third luminescent layer 130 may be disposed directly on top of the second luminescent layer 120. The third luminescent layer 130 also contains a composition of quantum dots 131 dispersed in a matrix 132. The quantum dots 131 are preferably, but are not limited to, CdSe quantum dots having an average particle diameter of about 2.1 nm and a peak emission at 480 nm. Such CdSe quantum dots are commercially available as Lumidot™ 480 from Nanoco Technologies Ltd, Manchester, United Kingdom. The refractive index of CdSe quantum dots 131 is about 2.5 at 450 nm. The volume fraction of quantum dots 131 in the third luminescent layer 130 may be about 20%. The material of matrix 132 is preferably a polymer, however, the matrix material may also be, but is not limited to, a silicone, epoxy, acrylic, plastic, or glass. The refractive index of matrix 132 may be 1.5. The effective refractive index of the second luminescent layer 120 may be 1.7 at a quantum dots volume fraction of 20%.

Alternatively, in some embodiments, the quantum dots 131 may be $CuInS_2$ quantum dots. The volume fraction of quantum dots 131 may be about 14% to achieve an effective refractive index of the third luminescent layer 130 of 1.7.

Alternatively, in some other embodiments, the quantum dots 131 may be ZnSe quantum dots. The refractive index of ZnSe quantum dots is 2.88 at 450 nm. The volume fraction of quantum dots 131 may be about 14% to achieve an effective refractive index of the third luminescent layer 130 of 1.7.

In a further embodiments, an encapsulant layer 140 may be disposed on top of the third luminescent layer 130. The material of encapsulant layer 140 may be a silicone, epoxy, acrylic, plastic, polymer or glass. The refractive index of the material of encapsulant layer 140 may be about 1.5 or less. Preferably, the encapsulant layer 140 is suitably impermeable to moisture and/or air to prevent the quantum dots from deteriorating over time.

Thus, the lighting device 100 has a gradient of refractive indices such that the indices of refraction decrease when proceeding from the layer closest to the light source 101 to the layer furtherst away. In particular, in a preferred embodiment as shown in FIG. 1, the indices of refraction decrease from the InGaN blue LED chip 101 with a refractive index of 2.61, through three luminescent layers 110, 120, 130 with effective refractive indices of 2.3, 2.0, 1.7, respectively, to the encapsulant layer 140 with a refractive index of about 1.5. The arrangement of layers with gradient refractive indices helps minimizing the index differences at the layer interfaces. Thus, the Fresnel reflection at each layer interface, as well as the overall reflection, may be significantly reduced. In some embodiments, more luminescent layers may be introduced into the lighting device 100. The volume fraction and types of quantum dots may be arranged so that the refractive index difference at each layer interface is further reduced, to further minimize the overall reflection. The efficiency of the lighting device 100 may be greatly enhanced by the arrangement of layers with gradient refractive indices, as more light may be extracted from the LED chip 101, instead of being reflected and absorbed within the lighting device 100. In addition, the typical diameter of the quantum dots is at least 10 times less than the wavelengths of visible light. Thus, the quantum dots do not infer Mie scattering of the visible light. Since no particles other than quantum dots need to be utilized to fine-tune the refractive index, no scattering centers are introduced.

In the embodiments described above, the absorption peak wavelength 205 (FIG. 2) of the quantum dots 121 in the second luminescent layer 120 is 540 nm. Therefore, a light converted by quantum dots 111, which is emitted at about 630 nm, is not be absorbed again and converted by quantum dots 121, which only absorbs light primarily below 540 nm. Also, since the Fresnel reflection is minimized at each layer interface, a light converted by quantum dots 121 in layer 120, has little possibility to be reflected back to layer 110 and further converted by quantum dots 111. Therefore, the light emitted from LED chip 101 is converted mostly only once by any of the quantum dots, maximizing the conversion efficiency.

Preferably, the refractive index of the quantum dots used herein is at least 2.2 at a wavelength of at least about 450 nm to avoid a prohibitively high volume fraction of quantum dots in the luminescent layers. The quantum dots may be binary, ternary, or quaternary compounds from III-V, II-VI, IV-VI groups. In addition, materials like $I-II_1-VI_2$, in particular $CuInSe_2$ and $CuInS_2$, can be synthesized as colloidal nanocrystals and exhibit quantum confinement effects. More particularly, the material of quantum dots may be CdS, CdSe, CdTe, CdPo, ZnS, ZnSe, ZnTe, ZnPo, HgS, HgSe, HgTe, MgS, MgSe, MgTe, PbSe, PbS, PbTe, GaN, GaP, GaAs, InP, InAs, $CuInS_2$, $CuInSe_2$, CuInTe, $ZnGeP_2$, CuSe, $CdS_{1-x}Se_x$, $BaTiO_3$, $PbZrO_3$, $PbZr_xTi_{1-x}O_3$, $Ba_xSr_{1-x}TiO_3$, $SrTiO_3$, LaMnO$_3$, CaMnO$_3$, or La$_{1-x}$Ca$_x$MnO$_3$. The quantum dots may be doped, such as ZnSe:Mn, whose emission is related to both the dopant and the size of the quantum dots. The quantum dots may have a core/shell structure. Quantum dots cores, which can be made from any of the above materials, typically lose some quantum efficiency due to the non-radiative processes at the surface defects, such as dangling bonds. Ligands may passivate some of them but not efficiently enough. Overcoating of the core with a shell of larger bandgap material, such as ZnSe or ZnS, results in passivation of surface defects and an increase of the quantum efficiency. The quantum dots also may be overcoated with ligands to prevent aggregation in the matrix. The ligands may be crosslinked to form polymeric micelles around the quantum dots.

Colloidal quantum dots may be synthesized by adding metallorganic precursors to the boiling solvent in presence of ligands. Supersaturation results in nucleation of nanocrystals, which can be further grown to the desired size. After completion of the growth and removal of undesired by-products of the reaction, another synthesis step may be conducted to grow the shell.

In some embodiments, one or more intermediate layers may be interspersed between the first luminescent layer 110 and the second luminescent layer 120, and/or the third luminescent layer 130 depending on the number of layers used. The intermediate layers must follow the arrangement of gradient refractive index so that the index of each layer is between that of the immediate upper and lower layers.

These intermediate layers may comprise one or more phosphors. For example, the intermediate layers may include a YAG:Ce phosphor having a refractive index of about 1.85 at 450 nm. The effective refractive index of the intermediate phosphor layer should be larger than the index of immediate upper layer, and smaller than the index of immediate lower layer. The phosphor layer may also contain quantum dots to further fine-tune the refractive index. The phosphors contained in these layer(s) also convert a portion of the light originally emitted by the LED into light of different wavelength. The combination of the converted light by quantum dots and phosphor and the originally emitted light may render a more desired output light with a better CRI and may achieve a warmer color temperature.

In another embodiment, the lighting device 100 may contain one or more oxide layers comprising TiO$_2$, ZnO, or ZrO$_2$ particles, on top of or in between the quantum dots layers. The TiO$_2$ particles have refractive indices of from 2.1 to 2.8. The ZnO and ZrO$_2$ particles have refractive indices of about 2.1 at 450 nm. The oxide layer may further contain quantum dots and phosphor. The layers must be arranged so that the effective refractive index of the oxide layer is between the indices of immediate upper and lower layers to minimize the Fresnel reflection. Preferably, an average diameter of the oxide particles is less than 100 nm, and more preferably less than 50 nm so that the particles are not scattering centers for the visible light.

Figure 3:
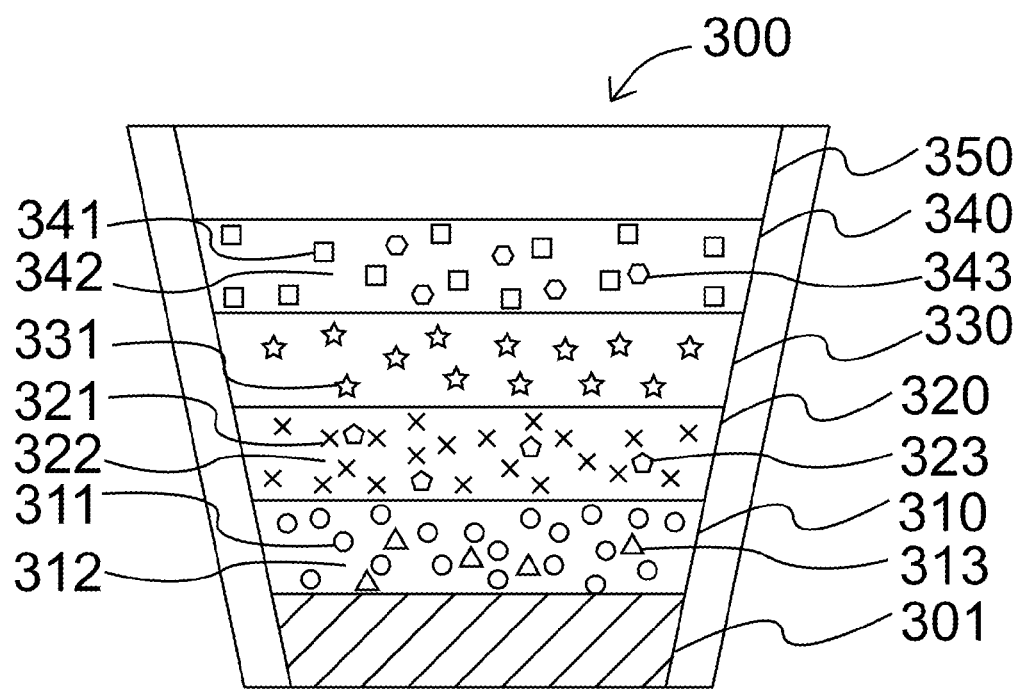
FIG. 3 is a schematic illustration of a lighting device according to another embodiment of the invention.

In yet another embodiment with reference to FIG. 3, the lighting device 300 includes a light source 301, which may be one or more LED chips, preferably a AlGaN or AlGaInN UV-LED chip, emitting light at the wavelength of about 370-400 nm. A first layer 310 may be disposed directly on top of the LED chip 301. The first layer 310 contains a composition of quantum dots 311 dispersed in a matrix 312 and a phosphor 313. A second layer 320 may be disposed directly on top of the first luminescent layer 310. The second layer 320 contains a composition of quantum dots 321 dispersed in a matrix 322 and a phosphor 323. A third layer 330 may be disposed directly on top of the second luminescent layer 320. The third layer 330 contains nanoscale TiO$_2$, ZnO, or ZrO$_2$ particles 331. A fourth layer 340 may be disposed directly on top of the third layer 330. The fourth layer 340 contains a composition of quantum dots 341 dispersed in a matrix 342 and a phosphor 343. An encapsulant layer 350 may be disposed directly on top of the fourth layer 340. The volume fractions of the quantum dots (311, 321, 341), the phosphors (313, 323, 343), and the oxide particles 331 are arranged so that the refractive index of each layer is less than the refractive index of the immediately underlying layer or chip. The quantum dots with emission peaks at longer wavelengths may be arranged in lower layers closer to the LED chip; while the quantum dots with emission peaks at shorter wavelengths may be arranged in higher layers farther from the LED chip.

While the principles of the invention have been described herein, it is to be understood by those skilled in the art that this description is made only by way of example and not as a limitation as to the scope of the invention. Reference numerals corresponding to the embodiments described herein may be provided in the following claims as a means of convenient reference to the examples of the claimed subject matter shown in the drawings. It is to be understood however, that the reference numerals are not intended to limit the scope of the claims. Other embodiments are contemplated within the scope of the present invention in addition to the exemplary embodiments shown and described herein. Modifications and substitutions by one of ordinary skill in the art are considered to be within the scope of the present invention, which is not to be limited except by the recitations of the following claims.

What is claimed is:

1. A lighting device comprising:
   a light source, the light source having a source refractive index;
   a first luminescent layer disposed on top of the light source, the first luminescent layer having a first effective refractive index, the first luminescent layer comprising a first quantum dots composition dispersed in a first matrix material, the first effective refractive index being equal to or less than the source refractive index;
   a second luminescent layer disposed on top of the first luminescent layer, the second luminescent layer having a second effective refractive index, the second luminescent layer comprising a second quantum dots composition dispersed in a second matrix material, the second effective refractive index being less than the first effective refractive index; and
   an oxide layer disposed on top of the second luminescent layer, an effective refractive index of the oxide layer is less than the second effective refractive index of the second luminescent layer.

2. The lighting device of claim 1, wherein the first quantum dots composition has a first emission spectrum having a first peak wavelength and the second quantum dots composition has a second emission spectrum having a second peak wavelength wherein the second peak wavelength is shorter than or equal to the first peak wavelength.

3. The lighting device of claim 1, wherein the first quantum dots composition has a first emission spectrum having a first peak wavelength and the second quantum dots composition has an absorption spectrum having an absorption peak wavelength wherein the first peak wavelength is longer than the absorption peak wavelength.

4. The lighting device of claim 1, wherein the first luminescent layer is disposed directly on top of the light source.

5. The lighting device of claim 1, wherein the second luminescent layer is disposed directly on top of the first luminescent layer.

6. The lighting device of claim 1, wherein the first or second quantum dots composition comprises at least one material selected from the group consisting of CdS, CdSe, CdTe, CdPo, ZnS, ZnSe, ZnTe, ZnPo, HgS, HgSe, HgTe, MgS, MgSe, MgTe, PbSe, PbS, PbTe, GaN, GaP, GaAs, InP, InAs, CuInS$_2$, CuInSe$_2$, CuInTe, ZnGeP$_2$, CuSe, CdS$_t$Se$_x$, BaTiO$_3$, PbZrO$_3$, PbZr$_x$Ti$_{1-x}$O$_3$, Ba$_x$Sr$_{1-x}$TiO$_3$, SrTiO$_3$, LaMnO$_3$, CaMnO$_3$, ZnSe:Mn, and La$_{1-x}$Ca$_x$MnO$_3$.

7. The lighting device of claim 1, wherein the refractive indices of the first quantum dots composition and second quantum dots composition are at least 2.2 at a wavelength of at least about 450 nm.

8. The lighting device of claim 1, wherein the first or second matrix material comprises at least one material selected from the group consisting of silicone, epoxy, acrylic, plastic, polymer and glass.

9. The lighting device of claim 1, further comprising an encapsulant layer disposed on top of the second luminescent layer, the encapsulant layer comprising at least one material selected from the group consisting of silicone, epoxy, acrylic, plastic, polymer and glass.

10. The lighting device of claim 1, wherein the first or second luminescent layer further comprises a phosphor composition.

11. The lighting device of claim 1, wherein the light source comprises a light emitting diode.

12. The lighting device of claim 11, wherein the light emitting diode is a blue light emitting diode or an ultraviolet light emitting diode.

13. The lighting device of claim 1, wherein the oxide layer comprises at least one oxide material selected from the group consisting of TiO$_2$, ZnO, and ZrO$_2$.

14. The lighting device of claim 13, wherein an average particle diameter of the oxide material is at most 100 nanometers.

15. The lighting device of claim 1, wherein the first quantum dots composition and the second quantum dots composition are comprised of a same material.

16. The lighting device of claim 15, wherein the first quantum dots composition has a first emission spectrum having a first peak wavelength and the second quantum dots composition has a second emission spectrum having a second peak wavelength wherein the second peak wavelength is shorter than the first peak wavelength.

17. A lighting device comprising:
an InGaN light emitting diode, the InGaN light emitting diode having a source refractive index;
a first luminescent layer disposed directly on top of the InGaN light emitting diode, the first luminescent layer having a first effective refractive index, the first luminescent layer comprising a InP quantum dots composition dispersed in a first matrix material, the InP quantum dots composition having a first emission spectrum having a first peak wavelength, the first effective refractive index being less than the source refractive index; and
a second luminescent layer disposed directly on top of the first luminescent layer, the second luminescent layer having an effective refractive index, the second luminescent layer comprising a CuInS$_2$ quantum dots composition dispersed in a second matrix material, the second CuInS$_2$ quantum dots composition having a second emission spectrum having a second peak wavelength, the second peak wavelength being shorter than the first peak wavelength, the second effective refractive index being less than the first effective refractive index.

18. A lighting device comprising:
an AlGaN light emitting diode, the AlGaN light emitting diode having a source refractive index;
a first luminescent layer disposed directly on top of the AlGaN light emitting diode, the first luminescent layer having a first effective refractive index, the first luminescent layer comprising a first InP quantum dots composition dispersed in a first matrix material, the first InP quantum dots composition having a first emission spectrum having a first peak wavelength, the first InP quantum dots composition having a first volume fraction, the first effective refractive index being less than the source refractive index;
a second luminescent layer disposed directly on top of the first luminescent layer, the second luminescent layer having a second effective refractive index, the second luminescent layer comprising a second InP quantum dots composition dispersed in a second matrix material, the second InP quantum dots composition having a second emission spectrum having a second peak wavelength, the second peak wavelength being shorter than or equal to the first peak wavelength, the second InP quantum dots composition having a second volume fraction, the second volume fraction being less than the first volume fraction, the second effective refractive index being less than the first effective refractive index wherein the first quantum dots composition has a first emission spectrum having a first peak wavelength and the second quantum dots composition has a second emission spectrum having a second peak wavelength wherein the second peak wavelength is shorter than or equal to the first peak wavelength; and
a third luminescent layer disposed directly on top of the second luminescent layer, the third luminescent layer having a third effective refractive index, the third luminescent layer comprising a ZnSe quantum dots composition dispersed in a third matrix material, the ZnSe quantum dots composition having a third emission spectrum having a third peak wavelength, the third peak wavelength being shorter than the second peak wavelength, the third effective refractive index being less than the second effective refractive index.

* * * * *